(12) United States Patent
Na et al.

(10) Patent No.: US 11,842,893 B2
(45) Date of Patent: Dec. 12, 2023

(54) PRINTED CIRCUIT BOARD AND PACKAGE SUBSTRATE INCLUDING SAME

(71) Applicant: LG INNOTEK CO., LTD., Seoul (KR)

(72) Inventors: Se Woong Na, Seoul (KR); Se Ho Myeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 97 days.

(21) Appl. No.: 17/621,810

(22) PCT Filed: Jun. 24, 2020

(86) PCT No.: PCT/KR2020/008232
§ 371 (c)(1),
(2) Date: Dec. 22, 2021

(87) PCT Pub. No.: WO2020/262961
PCT Pub. Date: Dec. 30, 2020

(65) Prior Publication Data
US 2022/0262713 A1    Aug. 18, 2022

(30) Foreign Application Priority Data
Jun. 24, 2019    (KR) .......................... 10-2019-0074959

(51) Int. Cl.
*H01L 21/48*    (2006.01)
*H01L 23/498*    (2006.01)
(Continued)

(52) U.S. Cl.
CPC .... *H01L 23/49822* (2013.01); *H01L 21/4857* (2013.01); *H01L 23/13* (2013.01);
(Continued)

(58) Field of Classification Search
CPC .... H01L 21/4857; H05K 1/183; H05K 1/186; H05K 1/113; H05K 3/4697; H05K 3/0017; H05K 2203/025
(Continued)

(56) References Cited

U.S. PATENT DOCUMENTS 9,005,456 B2    4/2015    You et al.
10,103,113 B2    10/2018    Ko et al.
(Continued)

FOREIGN PATENT DOCUMENTS

CN    1396798    2/2003
CN    101098588    1/2008
(Continued)

OTHER PUBLICATIONS

International Search Report dated Oct. 5, 2020 issued in Application No. PCT/KR2020/008232.
(Continued)

*Primary Examiner* — Andargie M Aychillhum
(74) *Attorney, Agent, or Firm* — KED & ASSOCIATES, LLP

(57) ABSTRACT

A printed circuit board according to an embodiment includes a first insulating layer; a second insulating layer disposed on the first insulating layer and including a cavity; and a pad disposed on the first insulating layer and exposed through the cavity; wherein the second insulating layer includes a first portion disposed on an upper surface of the first insulating layer in a region where the cavity is formed; and a second portion other than the first portion, and wherein a thickness of the first portion is smaller than a thickness of the second portion.

17 Claims, 8 Drawing Sheets

(51) Int. Cl.
    *H01L 23/13*     (2006.01)
    *H05K 1/18*     (2006.01)
    *H05K 3/46*     (2006.01)
    *H05K 1/11*     (2006.01)
    *H05K 3/00*     (2006.01)

(52) U.S. Cl.
    CPC ....... *H01L 23/49838* (2013.01); *H05K 1/183* (2013.01); *H05K 1/186* (2013.01); *H05K 3/4697* (2013.01); *H05K 1/113* (2013.01); *H05K 3/0017* (2013.01); *H05K 2203/025* (2013.01)

(58) Field of Classification Search
    USPC ......................................................... 361/761
    See application file for complete search history.

(56) References Cited

U.S. PATENT DOCUMENTS

| | | | |
|---|---|---|---|
| 2003/0015345 | A1 | 1/2003 | Arai et al. |
| 2006/0237225 | A1* | 10/2006 | Kariya .............. H01L 23/49827 174/262 |
| 2009/0168380 | A1* | 7/2009 | Hsu ..................... H01L 23/5389 361/761 |
| 2015/0334841 | A1 | 11/2015 | Schmid |
| 2015/0334843 | A1 | 11/2015 | Jung et al. |
| 2016/0021754 | A1* | 1/2016 | Chen ..................... H01L 25/105 29/841 |

FOREIGN PATENT DOCUMENTS

| | | | |
|---|---|---|---|
| JP | 2017-050312 | | 3/2017 |
| KR | 10-2010-0132814 | | 12/2010 |
| KR | 10-1304359 | | 9/2013 |
| KR | 10-2014-0056933 | | 5/2014 |
| KR | 10-2015-0092840 | | 8/2015 |
| KR | 10-1726568 | | 4/2017 |
| KR | 10-2017-0067472 | | 6/2017 |
| KR | 20170067472 | A * | 6/2017 |
| KR | 10-2017-0086921 | | 7/2017 |
| TW | 201919453 | | 5/2019 |

OTHER PUBLICATIONS

Chinese Office Action dated Jun. 28, 2023 issued in Application No. 202080046886.7.

* cited by examiner

PRINTED CIRCUIT BOARD AND PACKAGE SUBSTRATE INCLUDING SAME

CROSS-REFERENCE TO RELATED PATENT APPLICATIONS

This application is a U.S. National Stage Application under 35 U.S.C. § 371 of PCT Application No. PCT/KR2020/008232, filed Jun. 24, 2020, which claims priority to Korean Patent Application No. 10-2019-0074959, filed Jun. 24, 2019, whose entire disclosures are hereby incorporated by reference.

TECHNICAL FIELD

An embodiment relates to a printed circuit board and package substrate including same.

BACKGROUND ART

A printed circuit board (PCB) is a board in which a printed circuit is printed with a conductive material on an electrically insulating substrate.

The printed circuit board has a structure in which the mounting position of each element is determined and a circuit pattern connecting the elements is printed on the surface of the flat plate in order to densely mount various kinds of elements on the flat plate, or it is composed of an embedded structure in which the element is embedded in the inside of the printed circuit board.

Recently, in order to realize miniaturization and multi-functionality of electronic components, printed circuit boards are used in a multi-layered structure capable of high-density integration.

In general, a conventional embedded printed circuit board forms a cavity for embedding a device using a drill bit, or subsidiary materials such as a release film are used to seat the device, or a cavity for embedding the device was formed using sand blast.

However, in the case of using a drill bit as described above, the conventional embedded printed circuit board has a large tolerance in the position and depth of the processing area, so it is difficult to achieve high density integration, and thus a protective layer that is finally removed has to be formed.

In addition, the conventional embedded printed circuit board has difficulty in forming a cavity up to a desired depth when sand blasting is used as described above, and thus a stop layer has to be formed.

In addition, since manual work is required to use subsidiary materials such as a release film, it is not easy to reduce the size of the cavity, and there is a problem in that the manufacturing cost is increased.

On the other hand, when the protective layer or the stop layer is used, after the cavity is formed, a process of removing it must be performed inevitably, thereby complicating the process. In addition, the protective layer or the stop layer is formed of a metal, and thus the protective layer or the stop layer is removed by performing an etching process.

However, the protective layer or stop layer must have a thickness of at least 3 to 10 μm for the sand blast or laser process. Accordingly, when the protective layer or the stop layer is removed, there is a problem in that a part of the pad exposed through the cavity is also removed.

DISCLOSURE

Technical Problem

The embodiment provides a printed circuit board having a new structure, a package substrate, and a method for manufacturing the same.

In addition, the embodiment provides a printed circuit board, a package substrate, and a method of manufacturing the same, which can solve the reliability problem of the printed circuit board by forming a cavity through a sand blasting process without a stop layer.

In addition, the embodiment provides a printed circuit board, a package substrate, and a method of manufacturing the same that can improve adhesion with a molding layer to be laminated later by allowing a portion of the insulating layer in which the cavity is to be formed to remain on the surface with roughness.

The technical problems to be achieved in the proposed embodiment are not limited to the technical problems mentioned above, and other technical problems not mentioned in the embodiments will be clearly understood by those of ordinary skill in the art to which the embodiments proposed from the description below.

Technical Solution

A printed circuit board according to an embodiment includes a first insulating layer; a second insulating layer disposed on the first insulating layer and including a cavity; and a pad disposed on the first insulating layer and exposed through the cavity; wherein the second insulating layer includes a first portion disposed on an upper surface of the first insulating layer in a region where the cavity is formed; and a second portion other than the first portion, and wherein a thickness of the first portion is smaller than a thickness of the second portion.

In addition, an upper surface of the first portion of the second insulating layer is positioned lower than an upper surface of the pad.

In addition, the second insulating layer includes a second-first insulating layer disposed on the first insulating layer; and a second-second insulating layer disposed on the second-first insulating layer, wherein the cavity includes a first part disposed in the second-first insulating layer; and a second part disposed in the second-second insulating layer.

In addition, the first part does not pass the second-first insulating layer, and wherein the second part passes through the second-second insulating layer.

In addition, an upper width of the cavity is greater than a lower width of the cavity.

In addition, the second-first insulating layer includes a first region corresponding to the first part of the second insulating layer; and a second region corresponding to the second part of the second insulating layer; wherein a thickness of the first region is smaller than a thickness of the second region.

In addition, an upper surface of the first region of the second insulating layer is positioned lower than an upper surface of the pad.

In addition, an upper surface of the first region of the second insulating layer has a surface curvature.

On the other hand, the package substrate according to the embodiment includes a first insulating layer; a second insulating layer disposed on the first insulating layer and including a cavity; a pad disposed on the first insulating layer and exposed through the cavity; a connection portion disposed on the pad; and an electronic device disposed on the connection portion, wherein the second insulating layer includes: a second-first insulating layer disposed on the first insulating layer; and a second-second insulating layer disposed on the second-first insulating layer, wherein the cavity includes: a first part disposed in the second-first insulating layer; and a second part disposed in the second-second insulating layer, wherein the first part does not pass the second-first insulating layer, and wherein the second part passes through the second-second insulating layer In addition, the second-first insulating layer includes a first region corresponding to the first part of the second insulating layer; and a second region corresponding to the second part of the second insulating layer; and a thickness of the first region is smaller than a thickness of the second region.

In addition, an upper surface of the first region of the second insulating layer is positioned lower than an upper surface of the pad.

In addition, an upper surface of the first region of the second insulating layer has a curved surface, wherein a molding layer is disposed in the cavity and covering at least a part of the electronic device.

On the other hand, a manufacturing method of the printed circuit board according to the embodiment includes preparing a first insulating layer, forming a pad on an upper surface of the first insulating layer; forming a second insulating layer covering the pad on an upper surface of the first insulating layer; and forming a cavity exposing an upper surface of the pad by performing a cavity forming process of opening a part of the second insulating layer, wherein the second insulating layer includes a second-first insulating layer disposed on the first insulating layer; and a second-second insulating layer disposed on the second-first insulating layer, wherein the cavity includes a first part disposed in the second-first insulating layer and non-passing the second-first insulating layer; and a second part disposed in the second-second insulating layer and passing through the second-second insulating layer, wherein the first and second parts of the cavity are formed by controlling process conditions during the cavity forming process.

In addition, the cavity is formed by a sandblasting or laser process, and the process conditions include at least one of a process speed and a pressure.

In addition, the second insulating layer includes a first region corresponding to the first part of the second insulating layer; and a second region corresponding to the second part of the second insulating layer, wherein a thickness of the first region is smaller than a thickness of the second region, and an upper surface of the first region of the second insulating layer is positioned lower than the upper surface of the pad.

In addition, the upper surface of the first region of the second insulating layer has a surface curvature by the sandblasting or laser process.

Advantageous Effects

According to an embodiment, the printed circuit board includes a cavity. In this case, the cavity 160 has a non-passing structure rather than a passing structure through the second insulating layer 120. In this case, the cavity 160 exposes the pad 141*a* disposed on the first insulating layer 110. In addition, a bottom surface of the cavity 160 is positioned lower than an upper surface of the pad 141*a*. Accordingly, in the embodiment, it is not necessary to form an additional layer to form the cavity 160, and accordingly, the number of processes can be reduced. In addition, in the embodiment, it is possible to solve a loss due to a change in the thickness or shape of the pad 141*a* occurring in the process of removing the additional layer, and accordingly, product reliability may be improved.

In addition, according to the embodiment, the cavity 160 of the printed circuit board includes an inner wall S1 and a bottom surface S2. In this case, the inner wall S1 and the bottom surface S2 of the cavity 160 may not be flat and may have a certain surface roughness. In addition, an electronic device may be mounted on the pad 141*a* in the cavity 160. In addition, the molding layer 190 may be disposed in the cavity 160 to cover the electronic device. At this time, the inner wall and the bottom surface S2 of the cavity 160 have a certain surface roughness, so that the surface area in contact with the molding layer 190 can be increased, and accordingly, bonding strength during molding of the molding layer 190 may be improved.

DETAILED DESCRIPTION OF THE EMBODIMENTS

Hereinafter, preferred embodiments of the present invention will be described in detail with reference to the accompanying drawings.

However, the technical spirit of the present invention is not limited to some embodiments described, but may be implemented in various different forms, and, as long as it is within the scope of the technical spirit of the present invention, one or more of the components may be selectively combined and substituted between the embodiments.

In addition, terms (including technical and scientific terms) used in the embodiments of the present invention may be interpreted as meanings that can be generally understood by those of ordinary skill in the art to which the present invention pertains unless explicitly defined and described, and the meanings of commonly used terms such as predefined terms may be interpreted in consideration of the contextual meaning of the related art. In addition, the terms used in the embodiments of the present invention are for describing the embodiments and are not intended to limit the present invention.

In this specification, the singular may also include the plural unless specifically stated in the phrase, and when it is described as "A and (and) at least one (or more than one) of B and C", it may include one or more of all combinations that can be combined with A, B, and C. In addition, in describing the components of the embodiment of the present invention, terms such as first, second, A, B, (a), (b), etc. may be used.

These terms are only used to distinguish the component from other components, and are not limited to the essence, order, or order of the component by the term. And, when it is described that a component is 'connected', 'coupled' or 'contacted' to another component, the component is not only directly connected, coupled or contacted to the other component, but also with the component it may also include a case of 'connected', 'coupled' or 'contacted' due to another element between the other elements.

In addition, when it is described as being formed or disposed on "above (on) or below (under)" of each component, the above (on) or below (under) is one as well as when two components are in direct contact with each other. Also includes a case in which another component as described above is formed or disposed between two components. In addition, when expressed as "above (up) or below (under)", it may include not only the upward direction but also the meaning of the downward direction based on one component.

Hereinafter, embodiments of the present invention will be described in detail with reference to the accompanying drawings.

Figure 1:
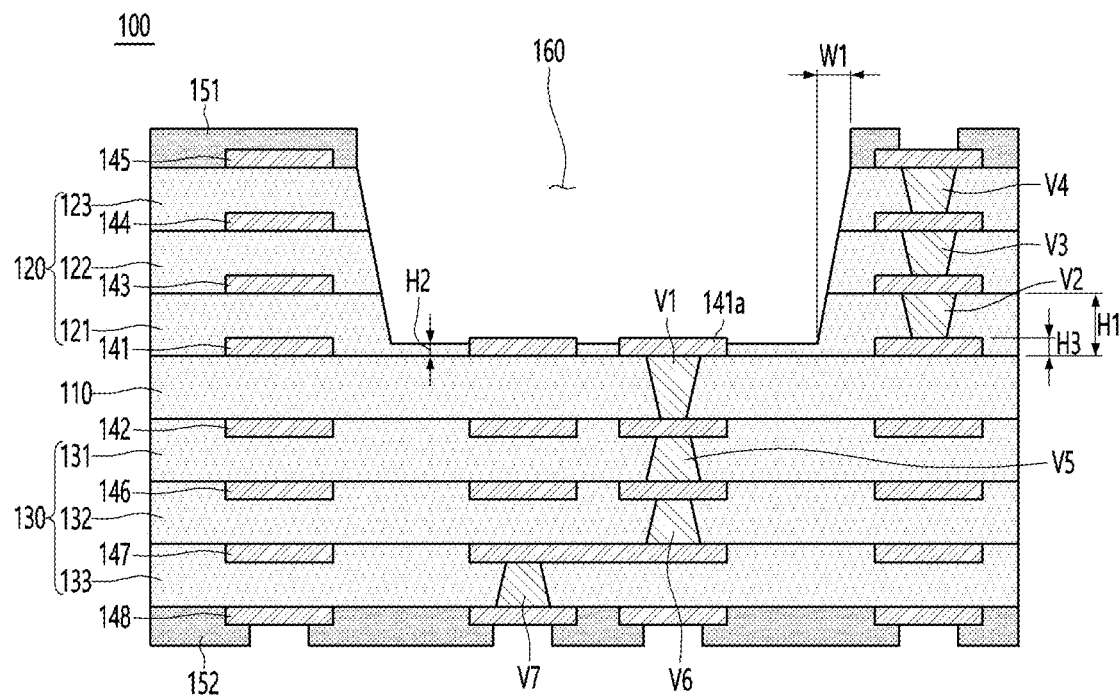
FIG. 1 is a view showing a printed circuit board according to an embodiment.
Figure 2:
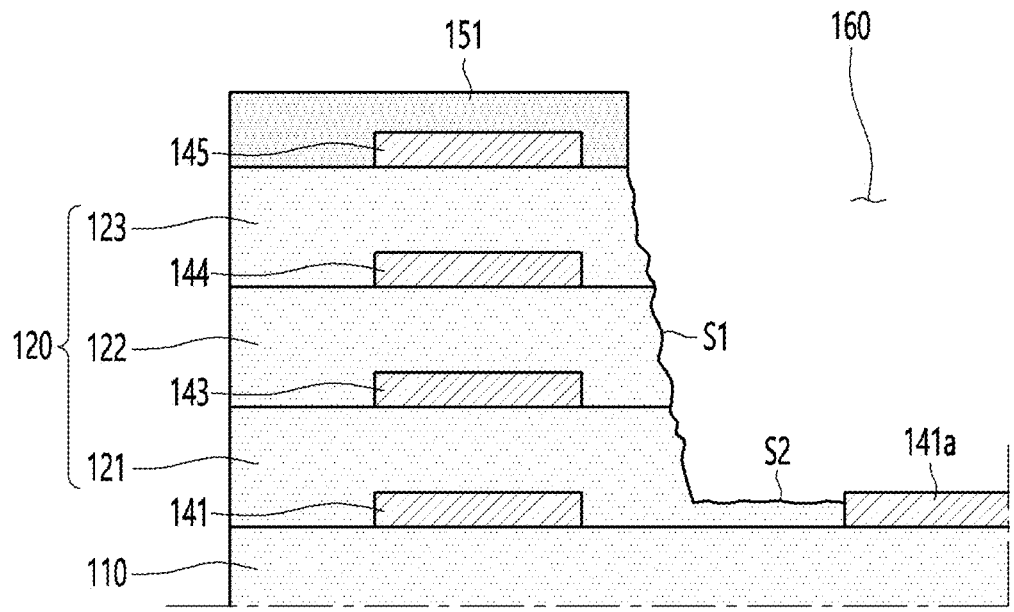
FIG. 2 is an enlarged view of a cavity region of FIG. 1.
Figure 3:
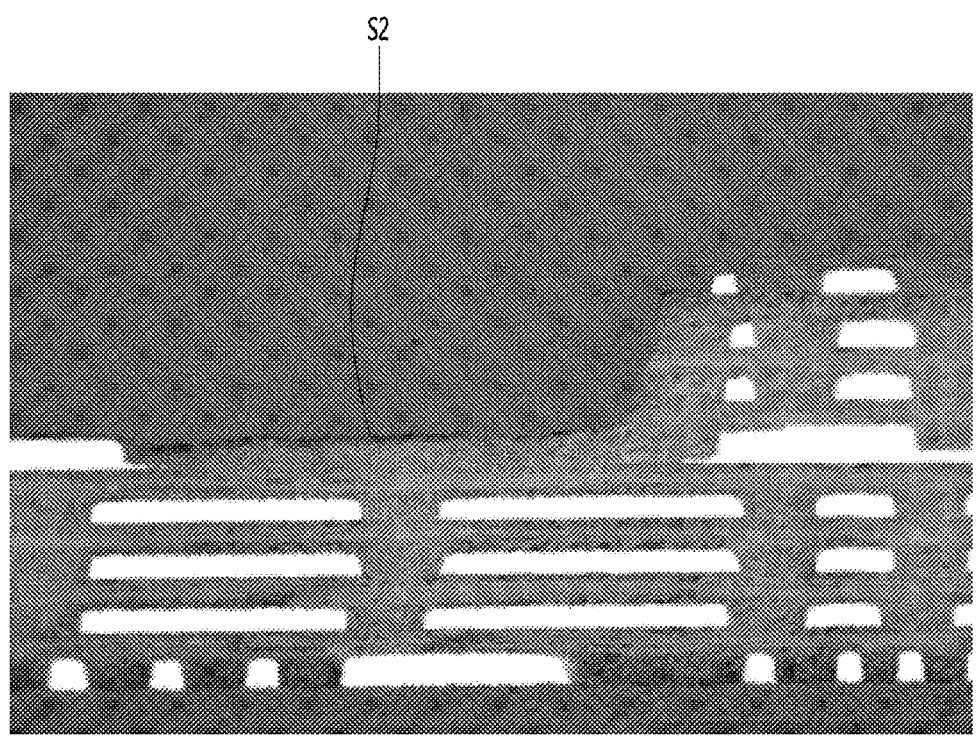
FIG. 3 is an enlarged microscope image of a cavity region of FIG. 1.

FIG. 1 is a view showing a printed circuit board according to an embodiment, FIG. 2 is an enlarged view of a cavity region of FIG. 1, and FIG. 3 is an enlarged microscope image of a cavity region of FIG. 1.

Referring to FIGS. 1 to 3, the printed circuit board 100 includes a first insulating layer 110, a second insulating layer 120, a third insulating layer 130, circuit patterns 141, 141, 143, 144, 145, 146, 147, 148, vias V1, V2, V3, V4, V5, V6, V7, and protective layers 151 and 152.

The first insulating layer 110 may be an insulating layer disposed in the center of the printed circuit board 100.

The second insulating layer 120 is disposed on the first insulating layer 110.

In addition, the third insulating layer 130 is disposed under the first insulating layer 110.

At this time, although the first insulating layer 110 is illustrated as being disposed in the center layer in the entire stacked structure of the printed circuit board 100 in the drawing, the embodiment is not limited thereto. That is, the first insulating layer 110 may be disposed at a position biased toward the upper side in the entire stacked structure of the printed circuit board 100, or, conversely, may be disposed at a position biased toward the lower side.

The second insulating layer 120 is disposed on the first insulating layer 110. In this case, the second insulating layer 120 has a plurality of layer structures. For example, the second insulating layer 120 may be included a second-first insulating layer 121 disposed on an upper surface of the first insulating layer 110, a second-second insulating layer 122 disposed on an upper surface of the second-first insulating layer 121, and a second-third insulating layer 123 disposed on an upper surface of the second-second insulating layer 122. At this time, although it is illustrated that the second insulating layer 120 has a three-layer structure in the drawings, the embodiment is not limited thereto. That is, the second insulating layer 120 may be composed of two or less layers, or alternatively, it may be composed with a structure of four or more layers.

In addition, the third insulating layer 130 is disposed under the first insulating layer 110. In this case, the third insulating layer 130 has a plurality of layer structures. For example, the third insulating layer 130 may include a third-first insulating layer 131 disposed under a lower surface of the first insulating layer 110, a third-second insulating layer 132 disposed under a lower surface of the third-first insulating layer 131, and a third-third insulating layer 133 disposed under a lower surface of the third-second insulating layer 132. At this time, although it is illustrated that the third insulating layer 130 has a three-layer structure in the drawings, the embodiment is not limited thereto. That is, the second insulating layer 130 may be composed with two or less layers, or alternatively, it may be composed with a structure of four or more layers.

In addition, although the printed circuit board 100 is illustrated as having a seven-layer structure based on the insulating layer in the drawings, the embodiment is not limited thereto. For example, the printed circuit board 100 may have a number of layers of 6 or less based on the insulating layer, or alternatively, may have a number of layers of 8 or more.

The first insulating layer 110, the second insulating layer 120, and the third insulating layer 130 are substrates on which an electric circuit capable of changing wiring is formed, and it may include a printed circuit board and an insulating substrate made of an insulating material capable of forming circuit patterns on the surface thereof.

For example, at least one of the first insulating layer 110, the second insulating layer 120, and the third insulating layer 130 may be rigid or flexible. For example, at least one of the first insulating layer 110, the second insulating layer 120, and the third insulating layer 130 may include glass or plastic. In detail, at least one of the first insulating layer 110, the second insulating layer 120, and the third insulating layer 130 may include chemically strengthened/halved with soda lime glass or aluminosilicate glass. containing tempered glass, or containing reinforced or flexible plastics such as polyimide (PI), polyethylene terephthalate (PET), propylene glycol (PPG), polycarbonate (PC), or sapphire.

In addition, at least one of the first insulating layer 110, the second insulating layer 120, and the third insulating layer 130 may include an optical isotropic film. For example, at least one of the first insulating layer 110, the second insulating layer 120, and the third insulating layer 130 may include a cyclic olefin copolymer (COC), a cyclic olefin polymer (COP), an optical isotropic polycarbonate (polycarbonate, PC) or photoisotropic polymethyl methacrylate (PMMA).

In addition, at least one of the first insulating layer 110, the second insulating layer 120, and the third insulating layer 130 may be bent while having a partially curved surface. That is, at least one of the first insulating layer 110, the second insulating layer 120, and the third insulating layer 130 may be partially flat and partially curved while having a curved surface. In detail, at least one of the first insulating layer 110, the second insulating layer 120, and the third insulating layer 130 may be curved while having a curved surface, or bent or curved while having a surface with random curvature.

In addition, at least one of the first insulating layer 110, the second insulating layer 120, and the third insulating layer 130 may be a flexible substrate having a flexible characteristic. In addition, at least one of the first insulating layer 110, the second insulating layer 120, and the third insulating layer 130 may be a curved or bent substrate. At this time, at least one of the first insulating layer 110, the second insulating layer 120, and the third insulating layer 130 expresses the electrical wiring connecting the circuit components based on the circuit design as a wiring diagram, and may reproduce an electrical conductor on insulators. In addition, at least one of the first insulating layer 110, the second insulating layer 120, and the third insulating layer 130 is equipped with an electric component, it is possible to form a wiring connecting them in a circuit, and it can mechanically fix parts other than the electrical connection function of the parts.

Circuit patterns may be disposed on surfaces of the first insulating layer 110, the second insulating layer 120, and the third insulating layer 130.

For example, the first circuit pattern 141 may be disposed on an upper surface of the first insulating layer 110. In this case, a plurality of first circuit patterns 141 may be disposed on the upper surface of the first insulating layer 110 while being spaced apart from each other by a predetermined distance.

A second circuit pattern 142 may be disposed on a lower surface of the first insulating layer 110. A plurality of second circuit patterns 142 may be disposed on the lower surface of the first insulating layer 110 while being spaced apart from each other by a predetermined distance.

Also, circuit patterns may be disposed on the surface of the second insulating layer 120. For example, a plurality of third circuit patterns 143 may be disposed on an upper surface of the second-first insulating layer 121 to be spaced apart from each other by a predetermined distance. Also, a plurality of fourth circuit patterns 144 may be disposed on an upper surface of the second-second insulating layer 122 to be spaced apart from each other by a predetermined distance. In addition, a plurality of fifth circuit patterns 145 may be disposed on the upper surface of the second-third insulating layer 123 to be spaced apart from each other by a predetermined distance.

Also, circuit patterns may be disposed on the surface of the third insulating layer 130. For example, a plurality of sixth circuit patterns 146 may be disposed on a lower surface of the third-first insulating layer 131 to be spaced apart from each other by a predetermined distance. Also, a plurality of seventh circuit patterns 147 may be disposed on a lower surface of the third-second insulating layer 132 to be spaced apart from each other by a predetermined distance. In addition, a plurality of eighth circuit patterns 148 may be disposed on a lower surface of the third-third insulating layer 133 to be spaced apart from each other by a predetermined distance.

Meanwhile, although the second insulating layer 120 in which the cavity 160 is formed is illustrated as being composed of a plurality of layers in the drawings, the embodiment is not limited thereto. For example, the second insulating layer 120 may be composed as a single layer. In addition, the second insulating layer 120 according to the embodiment may be made of resin coated copper (RCC).

That is, when the second insulating layer 120 is composed of a plurality of layers, each of the plurality of layers may be composed of RCC. In addition, when the second insulating layer 120 is composed of a single layer, the single layer may be composed of RCC.

Accordingly, the second insulating layer 120 may have a thickness of 5 μm to 20 μm. For example, when the second insulating layer 120 has a plurality of layer structures, each of the plurality of layers may have a thickness of 5 μm to 20 μm. Also, when the second insulating layer 120 has a single layer, the thickness of the second insulating layer 120 of the single layer may be 5 μm to 20 μm.

That is, the insulating layer constituting the circuit board in the comparative example was composed of a prepreg (PPG) containing glass fibers. In this case, it is difficult to reduce the thickness of the glass fiber based on the PPG of the circuit board in the comparative example. This is because, when the thickness of the PPG decreases, the glass fiber included in the PPG may be electrically connected to a circuit pattern disposed on a surface of the PPG, and thus a crack list is induced. Accordingly, in the case of reducing the thickness of the PPG of the circuit board in the comparative example, dielectric breakdown and damage to the circuit pattern may occur. Accordingly, the circuit board in the comparative example had a limit in reducing the overall thickness due to the thickness of the glass fibers constituting the PPG.

Moreover, since the circuit board in the comparative example is comprised with the insulating layer only of PPG containing glass fiber, it has a high dielectric constant. However, in the case of a dielectric having a high permittivity, there is a problem that it is difficult to use for high frequency. That is, in the circuit board of the comparative example, since the dielectric constant of the glass fiber is high, the dielectric constant is broken in the high frequency band.

Accordingly, in the embodiment, an insulating layer is formed by using an RCC having a low dielectric constant, thereby reducing the thickness of the circuit board and providing a highly reliable circuit board in which signal loss is minimized even in a high frequency band.

Meanwhile, as the second insulating layer 120 in the embodiment is made of RCC, the thickness of the printed circuit board can be remarkably reduced compared to the comparative example made of PPG. Accordingly, in the embodiment, the thickness of the printed circuit board can be reduced by at least 5 μm compared to the comparative example by using the RCC made of the low-dielectric constant material.

However, even when using an RCC having a low dielectric constant of 2.7, which is 10% improved from the level of 3.0, which is the dielectric constant of PPG, the decrease in thickness is only 10% compared to the comparative example. Therefore, in the embodiment, a cavity using a jig is formed in a portion on which a chip such as an electronic device is mounted to provide an optimal printed circuit board.

Meanwhile, the first to eighth circuit patterns 141, 142, 143, 144, 145, 146, 147, and 148 as described above are wirings that transmit electrical signals, and may be formed of a metal material having high electrical conductivity. To this end, the first to eighth circuit patterns 141, 142, 143, 144, 145, 146, 147, and 148 may be formed of at least one metal material selected from gold (Au), silver (Ag), platinum (Pt), titanium (Ti), tin (Sn), copper (Cu), and zinc (Zn). In addition, the first to eighth circuit patterns 141, 142, 143, 144, 145, 146, 147, and 148 may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the first to eighth circuit patterns 141, 142, 143, 144, 145, 146, 147, and 148 may be formed of copper (Cu), which has high electrical conductivity and is relatively inexpensive.

The first to eighth circuit patterns 141, 142, 143, 144, 145, 146, 147, and 148 may be formed by an additive process, a subtractive process, a modified semi additive process (MSAP) and a semi additive process (SAP) method, which is a typical printed circuit board manufacturing process, and a detailed description thereof will be omitted herein.

Meanwhile, the first circuit pattern 141 may include a pad 141a that is exposed through a cavity 160 while being disposed on the upper surface of the first insulating layer 110. The pad 141a may be electrically connected to an electronic device (described later) mounted in the cavity 160. For example, the pad 141a may be a wire bonding pad connected to an electronic device mounted in the cavity 160 through a wire. Alternatively, the pad 141a may be a flip-chip bonding pad directly connected to a terminal of an electronic device mounted in the cavity 160. This will be described in more detail below.

Meanwhile, each of the first to eighth circuit patterns 141, 142, 143, 144, 145, 146, 147, and 148 may include a pattern connected to a via for interlayer conduction, a pattern for signal transmission, and a pad connected to an electronic device and the like.

Vias V1, V2, V3, V4, V5, V6, and V7 that electrically connect circuit patterns disposed on different layers to each other may be disposed in the first insulating layer 110, the second insulating layer 120, and the third insulating layer 130. The vias V1, V2, V3, V4, V5, V6, and V7 may be disposed to pass through at least one of the first insulating layer 110, the second insulating layer 120, and the third insulating layer 130. In addition, both ends of the vias V1, V2, V3, V4, V5, V6, and V7 are respectively connected to circuit patterns disposed on different insulating layers, and thus an electrical signal may be transmitted.

A first via V1 may be disposed in the first insulating layer 110. The first via V1 may be disposed to pass through upper and lower surfaces of the first insulating layer 110. The first via V1 may electrically connects the first circuit pattern 141 disposed on the upper surface of the first insulating layer 110 and the second circuit pattern 142 disposed on the lower surface of the first insulating layer 110.

A plurality of vias may be disposed in the second insulating layer 120. That is, the second via V2 may be disposed in the second-first insulating layer 121. The second via V2 may be electrically connected the first circuit pattern 141 disposed on the upper surface of the first insulating layer 110 and the third circuit pattern 143 disposed on the upper surface of the second-first insulating layer 121.

In addition, a third via V3 may be disposed in the second-second insulating layer 122. The third via V3 may be electrically connected the fourth circuit pattern 144 disposed on the upper surface of the second-second insulating layer 122 and the third circuit pattern 143 disposed on the upper surface of the second-first insulating layer 121.

In addition, a fourth via V4 may be disposed in the second-third insulating layer 123. The fourth via V4 may be electrically connected the fifth circuit pattern 145 disposed on the upper surface of the second-third insulating layer 123 and the fourth circuit pattern 144 disposed on the upper surface of the second-second insulating layer 122.

A plurality of vias may be disposed in the third insulating layer 130. That is, a fifth via V5 may be disposed in the third-first insulating layer 131. The fifth via V5 may be electrically connected the second circuit pattern 142 disposed on the lower surface of the first insulating layer 110 and the sixth circuit pattern 146 disposed on the lower surface of the third-first insulating layer 131.

In addition, a sixth via V6 may be disposed in the third-second insulating layer 132. The sixth via V6 may be electrically connected the seventh circuit pattern 147 disposed on the lower surface of the third-second insulating layer 132 and the sixth circuit pattern 146 disposed on the lower surface of the third-first insulating layer 131.

Also, a seventh via V7 may be disposed in the third-third insulating layer 133. The seventh via V7 may be electrically connected the eighth circuit pattern 148 disposed on the lower surface of the third-third insulating layer 133 and the seventh circuit pattern 147 disposed on the lower surface of the third-second insulating layer 132.

Meanwhile, the vias V1, V2, V3, V4, V5, V6, and V7 may pass through only one insulating layer among the first insulating layer 110, the second insulating layer 120, and the third insulating layer 130, or alternatively, may be disposed while passing through a plurality of insulating layers in common. Accordingly, the vias V1, V2, V3, V4, V5, V6, and V7 may connect circuit patterns disposed on the surface of the insulating layer that are at least two or more apart from each other, rather than the neighboring insulating layers.

Meanwhile, the vias V1, V2, V3, V4, V5, V6, and V7 may be formed by filling the inside of a through hole (not shown) passing through at least one insulating layer among the plurality of insulating layers with a conductive material.

The through hole may be formed by any one of machining methods, including mechanical, laser, and chemical processing. When the through hole is formed by mechanical processing, methods such as milling, drilling, and routing may be used, and when the through hole is formed by laser processing, a UV or CO2 laser method may be used, and when the via hole is formed by chemical processing, drugs containing amino silane, ketones, etc. may be used, and the like, thereby the first insulating layer 110 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the drill for the laser processing, it is preferable to use a YAG (Yttrium Aluminum Garnet) laser, a CO2 laser, or an ultraviolet (UV) laser. The YAG laser is a laser that can process both the copper foil layer and the insulating layer, and the CO2 laser is a laser that can process only the insulating layer.

When the through hole is formed, the vias V1, V2, V3, V4, V5, V6, and V7 may be formed by filling the inside of the through hole with a conductive material. Metal materials forming the vias V1, V2, V3, V4, V5, V6, and V7 may be any one material selected from Cu, Ag, Sn, Au, Ni, and Pd, and the metal material may be filled using any one of electroless plating, electrolytic plating, screen printing, sputtering, evaporation, ink jetting and dispensing or combination thereof Meanwhile, protective layers 151 and 152 may be disposed on the surface of an outermost insulating layer among the first insulating layer 110, the second insulating layer 120, and the third insulating layer 130. For example, the first protective layer 151 may be disposed on the upper surface of the insulating layer disposed on the uppermost of the plurality of insulating layers. For example, the first protective layer 151 may be disposed on the upper surface of the second-third insulating layer 123 disposed on the uppermost portion of the second insulating layer 120. In addition, a second protective layer 152 may be disposed on a lower surface of the insulating layer disposed at the lowermost portion among the plurality of insulating layers. For example, the second protective layer 152 may be disposed on a lower surface of the third-third insulating layer 133 disposed at the lowermost portion of the third insulating layer 130.

The first protective layer 151 and the second protective layer 152 may each have an opening. For example, the first protective layer 151 may have an opening exposing the surface of the fifth circuit pattern to be exposed among the fifth circuit patterns 145 disposed on the upper surface of the second-third insulating layer 123.

Also, the second protective layer 152 may have an opening exposing the surface of the eighth circuit pattern to be exposed among the eighth circuit patterns 148 disposed on the lower surface of the third-third insulating layer 133.

The first protective layer 151 and the second protective layer 152 may include an insulating material. The first protective layer 151 and the second protective layer 152 may include various materials that can be cured by heating after being applied to protect the surface of the circuit patterns. The first protective layer 151 and the second protective layer 152 may be resist layers. For example, the first protective layer 151 and the second protective layer 152 may be a solder resist layer including an organic polymer material. For example, the first protective layer 151 and the second protective layer 152 may include an epoxy acrylate-based resin. In detail, the first protective layer 151 and the second protective layer 152 may include a resin, a curing agent, a photoinitiator, a pigment, a solvent, a filler, an additive, an acryl-based monomer, and the like. However, the embodiment is not limited thereto, and the first protective layer 151 and the second protective layer 152 may be any one of a photo solder resist layer, a cover-lay, and a polymer material.

A thickness of the first protective layer 151 and the second protective layer 152 may be 1 µm to 20 µm. The thickness of the first protective layer 151 and the second protective layer 152 may be 1 µm to 15 µm. For example, the thickness of the first protective layer 151 and the second protective layer 152 may be 5 µm to 20 µm. When the thickness of the first protective layer 151 and the second protective layer 151 is greater than 20 µm, the thickness of the printed circuit board may increase. When the thickness of the first protective layer 151 and the second protective layer 152 is less than 1 µm, the reliability of the circuit pattern may be deteriorated.

Meanwhile, a cavity 160 may be formed in the second insulating layer 120. In this case, the cavity 160 may be disposed in the second insulating layer 120 composed of a plurality of layers. In this case, the cavity 160 may be disposed to pass through at least one insulating layer among the second insulating layers 120 composed of the plurality of layers, and may be disposed to non-pass through at least another insulating layer.

That is, a general cavity 160 is disposed through the insulating layer. Accordingly, at the position where the cavity 160 is to be disposed, the insulating layer overlapping the cavity 160 in the horizontal direction does not exist. For example, the cavity in the comparative example is disposed to pass through the entire second insulating layer 120. For example, the cavity in the comparative example is disposed to pass through the lower surface of the second-first insulating layer 121 and the upper surface of the second-third insulating layer 123.

Unlike this, In the embodiment, in the cavity at a position where the cavity is to be disposed, at least one insulating layer among the insulating layers vertically overlapping with the cavity 160 passes through, but does not pass through at least another insulating layer.

That is, in the embodiment, the cavity 160 is disposed in the second insulating layer 120. That is, the cavity 160 is disposed in the second-first insulating layer 121, the second-second insulating layer 122, and the second-third insulating layer 123.

In this case, in the structure of the printed circuit board of the comparative example, the cavity is disposed to pass through all of the second-first insulating layer 121, the second-second insulating layer 122, and the second-third insulating layer 123. Accordingly, in the printed circuit board of the comparative example, the upper surface of the first insulating layer in the region vertically overlapping with the cavity is exposed. That is, the second insulating layer (more specifically, the second-first insulating layer) does not exist on the upper surface of the first insulating layer vertically overlapping with the cavity in the printed circuit board of the comparative example.

In contrast, the cavity 160 in the printed circuit board 100 according to the embodiment may be disposed without passing the second-third insulating layer 123 while passing the second-first insulating layer 121 and the second-second insulating layer 122.

That is, the cavity 160 may include a first part P1 disposed in the second-first insulating layer 121, a second part P2 disposed in the second-second insulating layer 122, and a third part P3 disposed in the second-third insulating layer 123. Here, as the second insulating layer 122 in the embodiment has a three-layer structure, the cavity 160 is illustrated as being composed of the first to third parts P1, P2, and P3, but the embodiment is not limited thereto. For example, when the second insulating layer 120 has a two-layer structure, the cavity 160 may include only the first and second parts. For example, when the second insulating layer 122 has a five-layer structure, the cavity 160 may include first to fifth parts. However, the cavity 160 in the embodiment is characterized in that the lowermost part has a groove shape rather than a through hole shape.

The first part P1 may be disposed in the second-first insulating layer 121. In this case, the first part P1 may be a groove disposed in the second-first insulating layer 121 and forming a lower region of the cavity 160.

The second part P2 may be disposed in the second-second insulating layer 122. The second part P2 is disposed in the second-second insulating layer 122 and may be a through hole forming a central region of the cavity 160.

The third part P3 may be disposed in the second-third insulating layer 123. The third part P3 is disposed in the second-third insulating layer 123 and may be a through hole forming an upper region of the cavity 160.

That is, the cavity 160 may be formed of a combination of the first part P1, the second part P2, and the third part P3. In this case, a thickness of the first part P1 may be smaller than the thickness of the second-first insulating layer 121. Accordingly, the cavity 160 may be formed without passing the second-first insulating layer 121.

In other words, the second-first insulating layer 121 may include a first region R1 disposed on a region vertically overlapping with the cavity 160 and a second region R2 excluding the first region R1. In addition, a thickness of the first region R1 may be different from a thickness of the second region R2.

Preferably, the thickness H1 of the second region R2 may be the thickness of the second-first insulating layer 121.

The thickness H1 of the second region R2 may be 20 µm to 100 µm. For example, the thickness H1 of the second region R2 may be 25 µm to 50 µm. For example, the thickness H1 of the second region R2 may be 30 µm to 40 µm. When the thickness H1 of the second region R2 exceeds 100 µm, the overall thickness of the printed circuit board 100 may increase. When the thickness H1 of the second region R2 is less than 20 µm, the pad 141a or the first circuit pattern cannot be stably protected. In addition, when the thickness H1 of the second region R2 is less than 20 µm, the second-first insulating layer 121 may be vulnerable to heat/pressure or the like in the process of mounting the electronic device.

A thickness H2 of the first region R1 may be smaller than a thickness H1 of the second region. The thickness H2 of the first region R1 may be determined by a thickness H3 of the pad 141a. Preferably, the thickness H2 of the first region R1 may be smaller than the thickness H3 of the pad 141a.

Preferably, the thickness H3 of the pad 141a may be smaller than the thickness H1 of the second region R2. For example, the thickness H3 of the pad 141a may be 5 μm to 30 μm.

In addition, a thickness H2 of the first region R1 may be smaller than a thickness H3 of the pad 141a. For example, the thickness H2 of the first region R1 may be 3 μm to 25 μm. Accordingly, the first region R1 of the second-first insulating layer 121 is disposed on the first insulating layer 110. In this case, the first region R1 of the second-first insulating layer 121 may expose the upper surface of the pad 141a disposed on the first insulating layer 110.

That is, in the embodiment, in order to mount the electronic device, the cavity 160 is not formed through the second insulating layer 120, the cavity 160 is formed in a state in which at least a portion of the second insulating layer 120 (the first region of the second-first insulating layer 121) remains on the first insulating layer 110.

In this case, the thickness H2 of a portion of the remaining second insulating layer 120 is smaller than the thickness H3 of the pad 141a to be exposed on the cavity 160. Accordingly, in an embodiment, the cavity 160 may be formed while maintaining the shape of the pad 141a without affecting the mounting of the electronic device on the pad 141a.

That is, in the prior art, in order to form cavities in the plurality of insulating layers as described above, the cavity forming process was performed in a state in which a protective layer or a stop layer was disposed on the first insulating layer. Accordingly, in the prior art, the cavity could be formed to a desired depth (a depth passing all of the second insulating layer). However, in the related art, after the cavity is formed, an etching process of removing the protective layer or the stop layer has to be performed. Accordingly, in the prior art, a portion of the pad disposed on the first insulating layer is also removed during the etching process of removing the protective layer or the stop layer, which may cause a problem in reliability of the pad. At this time, the thickness of the protective layer or stop layer required for sand blasting or laser processing is 3 um to 10 um, and accordingly, there is a problem in that an amount corresponding to the thickness of the protective layer or the stop layer among the total thickness of the pad is removed during the etching process.

Accordingly, in the embodiment, the cavity can be easily formed without forming the protective layer or the stop layer, thereby solving the reliability problem that occurs during the process of removing the protective layer or the stop layer.

And, this allows the cavity 160 to be formed without passing the second-first insulating layer 121 by controlling the process conditions for forming the cavity.

In this case, the cavity 160 may be formed by a sandblasting process. It may be formed by a sandblasting process. The sandblasting process refers to a process of forming a through hole or cavity having a desired shape on the substrate by spraying an abrasive such as sand from a nozzle together with high-pressure air to collide with the surface of a substrate or the like. In addition, the cavity 160 may be formed by a laser process rather than a sandblasting process, and even when formed by a laser process, the cavity 160 may be formed to a desired depth by controlling the layer process conditions. Hereinafter, it will be described that the cavity 160 is formed by sandblasting, but the embodiment is not limited thereto.

Here, in the absence of the protective layer or the stop layer, it is not easy to form a cavity to a desired depth through the sandblasting process. At this time, in the embodiment, the process conditions of the sandblasting are controlled based on the range between the minimum depth and the maximum depth that the cavity 160 should have, and through this, the cavity 160 can be formed to a desired depth. Here, the controlled process conditions may include a sand blast process speed and pressure. That is, by changing the process speed and pressure conditions while the sandblasting process progress time is fixed, the depth of the cavity 160 can be controlled in um units. Accordingly, in the embodiment, the cavity 160 can be formed within a range between a minimum depth and a maximum depth that the cavity should have by adjusting the sandblasting process speed and pressure. The maximum depth of the cavity 160 may be smaller than the total thickness of the second insulating layer 120. Also, the minimum depth of the cavity 160 may be greater than a depth obtained by subtracting the thickness of the pad 141a from the total thickness of the second insulating layer 120. Accordingly, the upper surface of the first region R1 of the second-first insulating layer 121 of the second insulating layer 120 in the embodiment is positioned higher than the upper surface of the first insulating layer 110, and the upper surface of the first region R1 is positioned lower than the upper surface of the pad 141a.

Meanwhile, referring to FIGS. 2 and 3, the cavity 160 includes an inner wall S1 and a bottom surface S2.

The inner wall S1 and the bottom surface S2 of the cavity 160 may have a predetermined surface roughness. At this time, in the embodiment, an additional process is not performed so that the inner wall S1 and the bottom surface S2 of the cavity 160 have a predetermined surface roughness, and the surface roughness may be formed during the sandblasting process for forming the cavity 160.

In other words, the bottom surface S2 of the cavity 160 may mean the upper surface of the first region R1 of the second-first insulating layer 121. In addition, the height of the upper surface of the first region R1 of the second-first insulating layer 121 is not constant and may have a deviation depending on the position.

Figure 4:
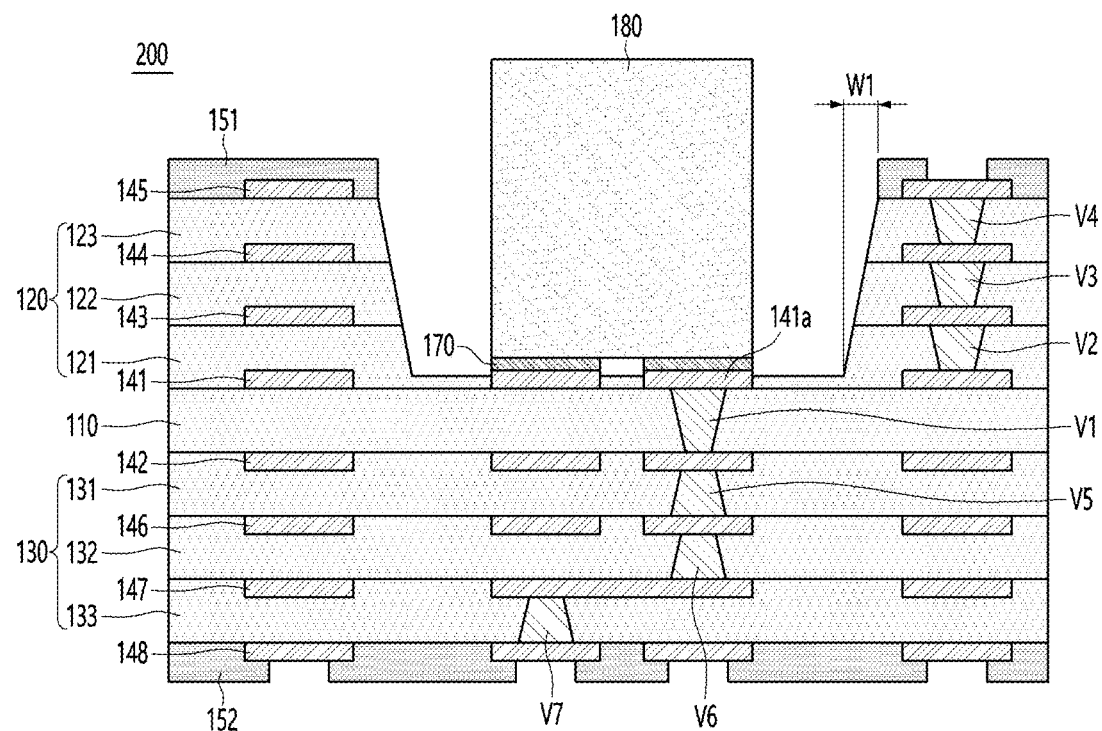
FIG. 4 is a view showing a package substrate according to a first embodiment.

FIG. 4 is a view showing a package substrate according to a first embodiment.

Referring to FIG. 4, a package substrate 200 in the embodiment includes the printed circuit board 100 shown in FIG. 1 and the electronic device 180 mounted in the cavity 160 of the printed circuit board 100.

The printed circuit board 100 described with reference to FIG. 1 may be used as a package substrate 200 for mounting the electronic device 180.

At this time, since the printed circuit board 100 has already been described in detail in FIG. 1, a description thereof will be omitted.

The printed circuit board 100 includes a cavity 160, and a pad 141a may be exposed in the cavity 160. In this case, the second-first insulating layer 121 may be disposed in the cavity 160 except for the region where the pad 141a is formed. However, the height of the first region R1 of the second-first insulating layer 121 is lower than the height of the pad 141a. Accordingly, the electronic device 180 may be stably mounted on the pad 141a without being affected by the second-first insulating layer 121 on the first region R1. In other words, when the height of the first region R1 of the second-first insulating layer 121 is higher than the height of the pad 141a, the electronic device 180 may be mounted on the pad 141*a* in an inclined state, and furthermore, a defect may occur in an electrical connection state with the pad 141*a*.

In this case, the electronic device 180 may be electronic components such as chips, which may be divided into active devices and passive devices. In addition, the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general printed circuit board to increase a signal processing speed of a semiconductor chip, which is an active device, or to perform a filtering function.

Meanwhile, a connection portion 170 may be disposed on the pad 141*a*. A planar shape of the connection portion 170 may be a quadrangle. The connection portion 170 is disposed on the pad 141*a* and electrically connects the electronic device 180 and the pad 141*a* while fixing the electronic device 180. To this end, the pad 141*a* may be formed of a conductive material. For example, the connection portion 170 may be a solder ball. In the connection portion 170, a heterogeneous material may be contained in the solder. The solder may be composed of at least one of SnCu, SnPb, and SnAgCu. In addition, the heterogeneous material may include any one of Al, Sb, Bi, Cu, Ni, In, Pb, Ag, Sn, Zn, Ga, Cd, and Fe.

Meanwhile, the upper surface of the electronic device 180 may be positioned higher than the surface of the uppermost layer of the printed circuit board 100. However, the embodiment is not limited thereto, and depending on the type of the electronic device 180, the upper surface of the electronic device 180 may be disposed at the same height as the surface of the uppermost layer of the printed circuit board 100 or may be positioned lower otherwise.

Figure 5:
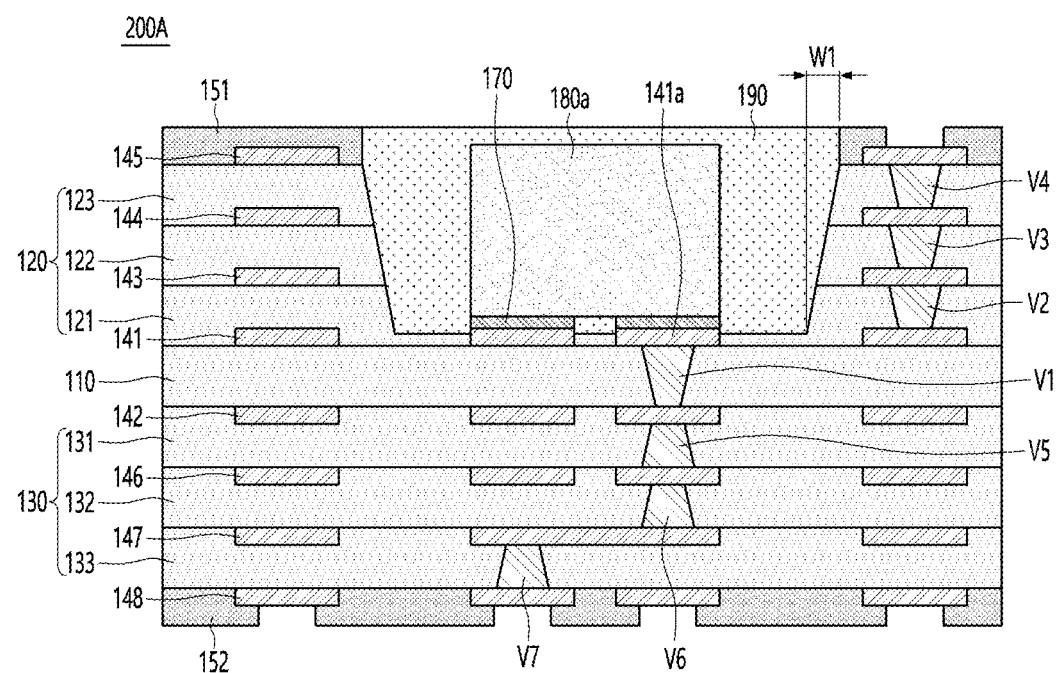
FIG. 5 is a view showing a package substrate according to a second embodiment.

FIG. 5 is a view showing a package substrate according to a second embodiment.

Referring to FIG. 5, the package substrate 200A in the embodiment includes the printed circuit board 100 shown in FIG. 1 and an electronic device 180*a* mounted in the cavity 160 of the printed circuit board 100.

In addition, the package substrate 200A further includes a molding layer disposed in the cavity 160 to cover the electronic device 180*a*.

The molding layer 190 may be selectively disposed in the cavity 160 to protect the electronic device 180*a* mounted in the cavity 160.

The molding layer 190 may be formed of a molding resin, for example, EMC (Epoxy Molding Compound). However, the embodiment is not limited thereto, and the molding layer 190 may be formed of various other molding resins in addition to EMC.

The printed circuit board 100 described with reference to FIG. 1 may be used as a package substrate 200A for mounting the electronic device 180*a*.

The printed circuit board 100 includes a cavity 160, and a pad 141*a* may be exposed in the cavity 160. In this case, the second-first insulating layer 121 may be disposed in the cavity 160 except for the region where the pad 141*a* is formed. However, the height of the first region R1 of the second-first insulating layer 121 is lower than the height of the pad 141*a*. Accordingly, the electronic device 180*a* may be stably mounted on the pad 141*a* without being affected by the second-first insulating layer 121 on the first region R1. In other words, when the height of the first region R1 of the second-first insulating layer 121 is higher than the height of the pad 141*a*, the electronic device 180*a* may be mounted on the pad 141*a* in an inclined state, and furthermore, a defect may occur in an electrical connection state with the pad 141*a*.

Meanwhile, in the embodiment, the inner wall S1 and the bottom surface S2 of the cavity 160 are not flat, but may have a certain curvature. In other words, the inner wall S1 and the bottom surface S2 of the cavity 160 may have a surface roughness of a certain level or more. That is, the inner wall S1 and the bottom surface S2 of the cavity 160 may have roughness.

In the embodiment, the molding layer 190 is disposed in contact with the inner wall S1 and the bottom surface S2 of the cavity 160. At this time, the inner wall S1 and the bottom surface S2 of the cavity 160 are not flat but have a certain curvature. The structure of the cavity 160 as described above can increase the surface area in contact with the molding layer 190, and accordingly, the bonding force between the molding layer 190 and the printed circuit board 100 may be improved.

According to an embodiment, the printed circuit board includes a cavity. In this case, the cavity 160 has a non-passing structure rather than a passing structure through the second insulating layer 120. In this case, the cavity 160 exposes the pad 141*a* disposed on the first insulating layer 110. In addition, a bottom surface of the cavity 160 is positioned lower than an upper surface of the pad 141*a*. Accordingly, in the embodiment, it is not necessary to form an additional layer to form the cavity 160, and accordingly, the number of processes can be reduced. In addition, in the embodiment, it is possible to solve a loss due to a change in the thickness or shape of the pad 141*a* occurring in the process of removing the additional layer, and accordingly, product reliability may be improved.

In addition, according to the embodiment, the cavity 160 of the printed circuit board includes an inner wall S1 and a bottom surface S2. In this case, the inner wall S1 and the bottom surface S2 of the cavity 160 may not be flat and may have a certain surface roughness. In addition, an electronic device may be mounted on the pad 141*a* in the cavity 160. In addition, the molding layer 190 may be disposed in the cavity 160 to cover the electronic device. At this time, the inner wall and the bottom surface S2 of the cavity 160 have a certain surface roughness, so that the surface area in contact with the molding layer 190 can be increased, and accordingly, bonding strength during molding of the molding layer 190 may be improved.

Hereinafter, a method of manufacturing a printed circuit board according to an embodiment will be described with reference to the accompanying drawings.

Figure 6:
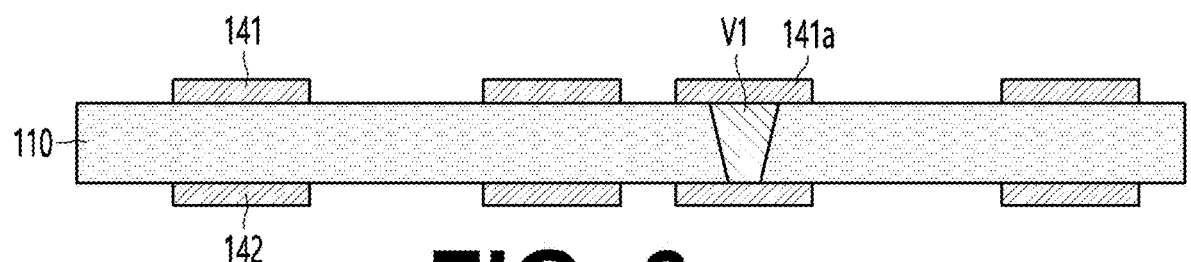
FIGS. 6 to 11 are views showing a manufacturing method of the printed circuit board shown in FIG. 1 in order of process.

FIGS. 6 to 11 are views showing a manufacturing method of the printed circuit board shown in FIG. 1 in order of process Referring to FIG. 6, the first insulating layer 110 may be prepared, and first and second circuit patterns 141 and 142 may be formed on the surface of the first insulating layer 110, and the first via V1 passing through the first insulating layer 110 and electrically connecting the first and second circuit patterns 141 and 142 may be formed.

The first insulating layer 110 may be a prepreg. The prepreg (PPG) has good flowability and adhesion in a semi-cured state, it is used as an intermediate substrate for fiber-reinforced composite materials used as an adhesive layer and an insulating material layer, and it is a molding material in which reinforcing fibers are pre-impregnated with a matrix resin. A molded article is formed by laminating these prepregs and curing the resin by heating/pressing. That is, the prepreg refers to a material that is impregnated with resin (BT/Epoxy, FR4, FR5, etc.) into glass fiber and cured to B-stage.

That is, the first insulating layer 110 may be a thermosetting or thermoplastic polymer substrate, a ceramic substrate, an organic-inorganic composite material substrate, or a glass fiber impregnated substrate. In the case of including a polymer resin, an epoxy-based insulating resin may be included, and alternatively, a polyimide-based resin may be included.

The first insulating layer 110 is a substrate on which an electric circuit capable of changing wiring is formed, and it may include a printed circuit board and an insulating substrate made of an insulating material capable of forming circuit patterns on the surface thereof.

A metal layer (not shown) is laminated on the surface of the first insulating layer 110. The metal layer may be formed by electroless plating a metal including copper on the first insulating layer 110. In addition, unlike the formation of the metal layer by electroless plating on the first insulating layer 110, copper clad laminate (CCL) may be used.

When the metal layer is formed by electroless plating, roughness is provided to the upper surface of the first insulating layer 110 so that plating can be performed smoothly. Then, by patterning the metal layer, first and second circuit patterns 141 and 142 are respectively formed on the upper and lower surfaces of the first insulating layer 110. In this case, the first circuit pattern 141 may include a pad 141a connected to the electronic devices 180 and 180a to be mounted on the first insulating layer 110 later through the connection portion 170.

As described above, the first and second circuit patterns 141 and 142 may be formed by an additive process, a subtractive process, a modified semi additive process (MSAP) and a semi additive process (SAP) method, which is a typical printed circuit board manufacturing process, and a detailed description thereof will be omitted herein.

Figure 7:
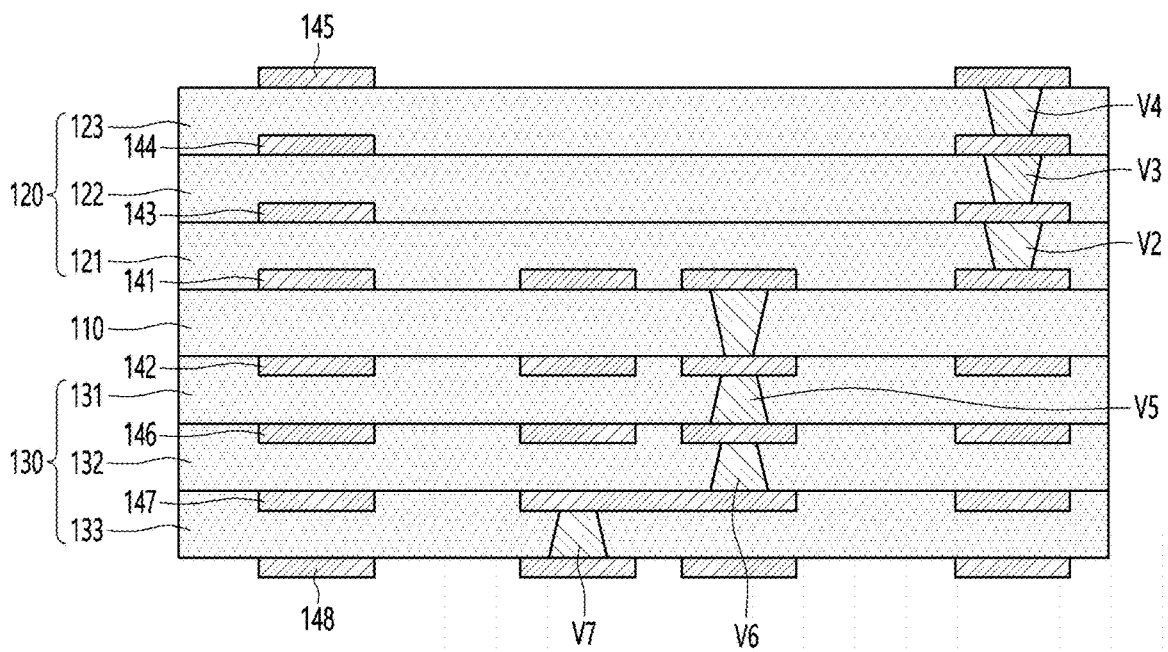

Next, referring to FIG. 7, a process of laminating the second insulating layer 120 and the third insulating layer 130 on upper and lower portions of the first insulating layer 110 may be performed, respectively.

In this case, the second insulating layer 120 has a plurality of layer structures. For example, the second insulating layer 120 may include the second-first insulating layer 121 disposed on the upper surface of the first insulating layer 110, the second-second insulating layer 122 disposed on the upper surface of the second-first insulating layer 121, and the second-third insulating layer 123 disposed on the upper surface of the second-second insulating layer 122.

In addition, the third insulating layer 130 has a plurality of layer structures. For example, the third insulating layer 130 may include the third-first insulating layer 131 disposed under a lower surface of the first insulating layer 110, the third-second insulating layer 132 disposed under a lower surface of the third-first insulating layer 131, and the third-third insulating layer 133 disposed under a lower surface of the third-second insulating layer 132.

In addition, a process of forming a circuit pattern on the surface of the second insulating layer 120 may be performed. For example, a process of forming a plurality of third circuit patterns 143 spaced apart from each other by a predetermined distance on the upper surface of the second-first insulating layer 121 may be performed. In addition, a process of forming a plurality of fourth circuit patterns 144 spaced apart from each other by a predetermined distance may be performed on the upper surface of the second-second insulating layer 122. In addition, a process of forming a plurality of fifth circuit patterns 145 spaced apart from each other by a predetermined distance on the upper surface of the second-third insulating layer 123 may be performed.

In addition, a process of forming a circuit pattern on the surface of the third insulating layer 130 may be performed. For example, a process of forming a plurality of sixth circuit patterns 146 spaced apart from each other by a predetermined distance on the lower surface of the third-first insulating layer 131 may be performed. In addition, a process of forming a plurality of seventh circuit patterns 147 spaced apart from each other by a predetermined distance on the lower surface of the third-second insulating layer 132 may be performed. In addition, a process of forming a plurality of eighth circuit patterns 148 spaced apart from each other by a predetermined distance on the lower surface of the third-third insulating layer 133 may be performed.

In addition, a process of forming vias V1, V2, V3, V4, which electrically connect circuit patterns disposed on different layers in the first insulating layer 110, the second insulating layer 120, and the third insulating layer 130 to each other may be performed.

Figure 8:
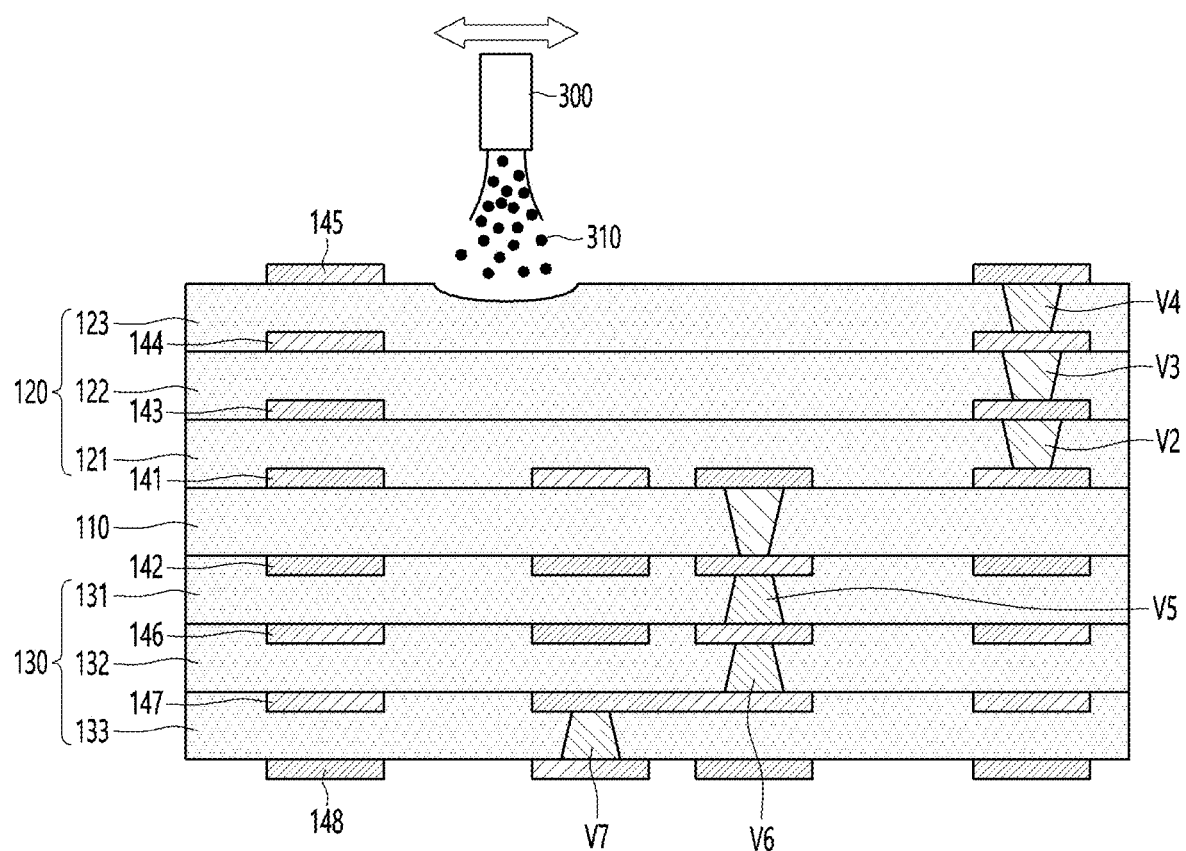

Next, referring to FIG. 8, a process of forming the cavity 160 on the cavity region of the second insulating layer 120 may be performed. In this case, the cavity 160 may be formed in the second insulating layer 120 composed of a plurality of layers.

In this case, the cavity 160 may be formed by a sandblasting process. It may be formed by a sandblasting process. The sandblasting process refers to a process of forming a through hole or cavity having a desired shape on the substrate by spraying an abrasive 310 such as sand from a nozzle together with high-pressure air using the sandblasting equipment 300 to collide with the surface of a substrate, etc.

Here, in the absence of the protective layer or the stop layer, it is not easy to form a cavity to a desired depth through the sandblasting process. At this time, in the embodiment, the process conditions of the sandblasting are controlled based on the range between the minimum depth and the maximum depth that the cavity 160 should have, and through this, the cavity 160 can be formed to a desired depth. Here, the controlled process conditions may include a sand blast process speed and pressure. That is, by changing the process speed and pressure conditions while the sandblasting process progress time is fixed, the depth of the cavity 160 can be controlled in um units. Accordingly, in the embodiment, the cavity 160 can be formed within a range between a minimum depth and a maximum depth that the cavity should have by adjusting the sandblasting process speed and pressure. The maximum depth of the cavity 160 may be smaller than the total thickness of the second insulating layer 120. Also, the minimum depth of the cavity 160 may be greater than a depth obtained by subtracting the thickness of the pad 141a from the total thickness of the second insulating layer 120.

Figure 9:
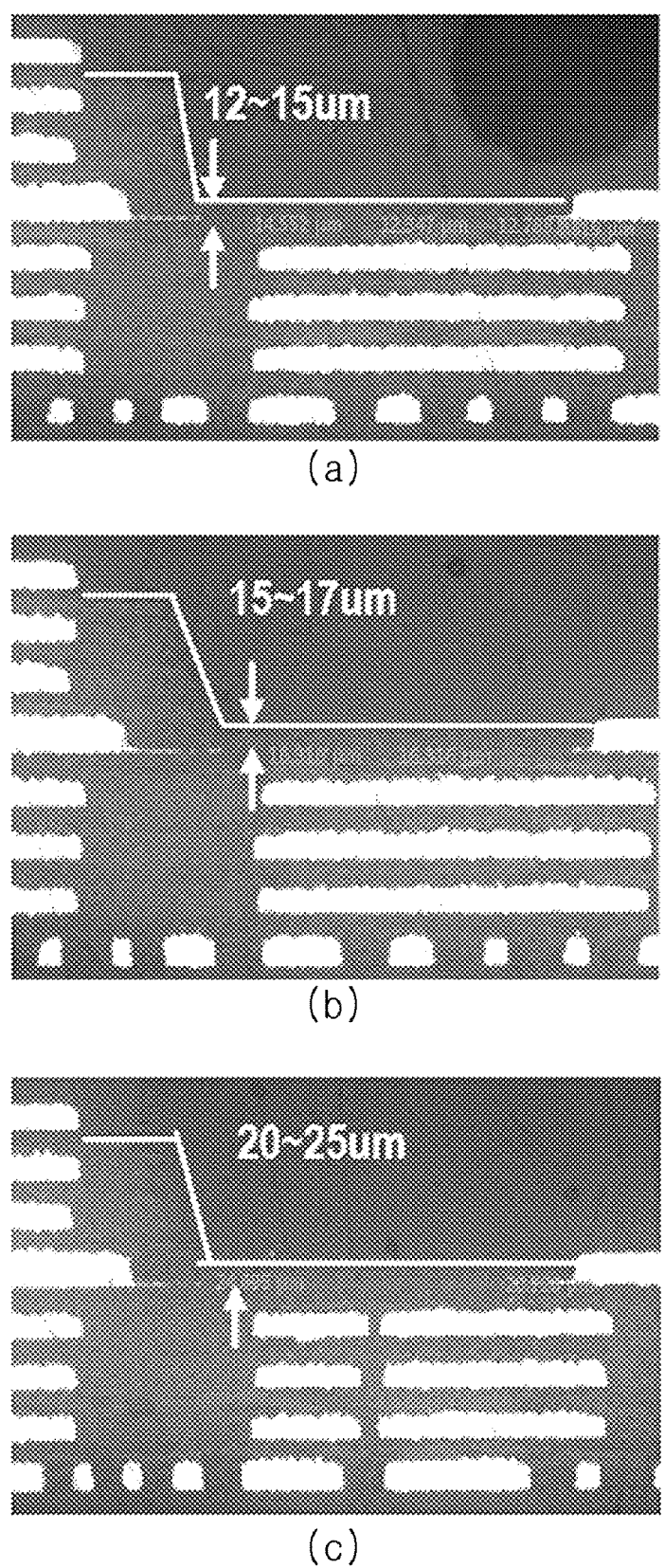

Referring to FIG. 9, it can be seen that a change occurs in the depth of the cavity 160 according to a change in the sandblasting process condition.

FIG. 9 (a) illustrates the thickness H3 of the first region R1 of the second-first insulating layer 121 that appears when the cavity 160 is formed under a first process condition. For example, the first process condition may include a first conveyor speed condition, which may be 19 mm/min. That is, when the cavity 160 is formed under the condition of the first conveyor speed, it can be seen that the thickness H3 of the first region R1 of the second-first insulating layer 121 is in the range of 12 μm to 15 μm.

FIG. 9 (b) illustrates the thickness H3 of the first region R1 of the second-first insulating layer 121 that appears when the cavity 160 is formed under a second process condition. For example, the second process condition may include a second conveyor speed condition, which may be 19.5 mm/min. That is, when the cavity 160 is formed under the condition of the second conveyor speed, it can be seen that the thickness H3 of the first region R1 of the second-first insulating layer 121 is in the range of 15 µm to 17 µm.

FIG. 9 (c) illustrates the thickness H3 of the first region R1 of the second-first insulating layer 121 that appears when the cavity 160 is formed under a third process condition. For example, the third process condition may include a third conveyor speed condition, which may be 20 mm/min. That is, when the cavity 160 is formed under the condition of the first conveyor speed, it can be seen that the thickness H3 of the first region R1 of the second-first insulating layer 121 is in the range of 20 µm to 55 µm.

Accordingly, in the embodiment, the cavity 160 can be formed to a desired depth by controlling the conveyor speed condition based on the thickness range of the first region R1 that the cavity 160 should have.

Figure 10:
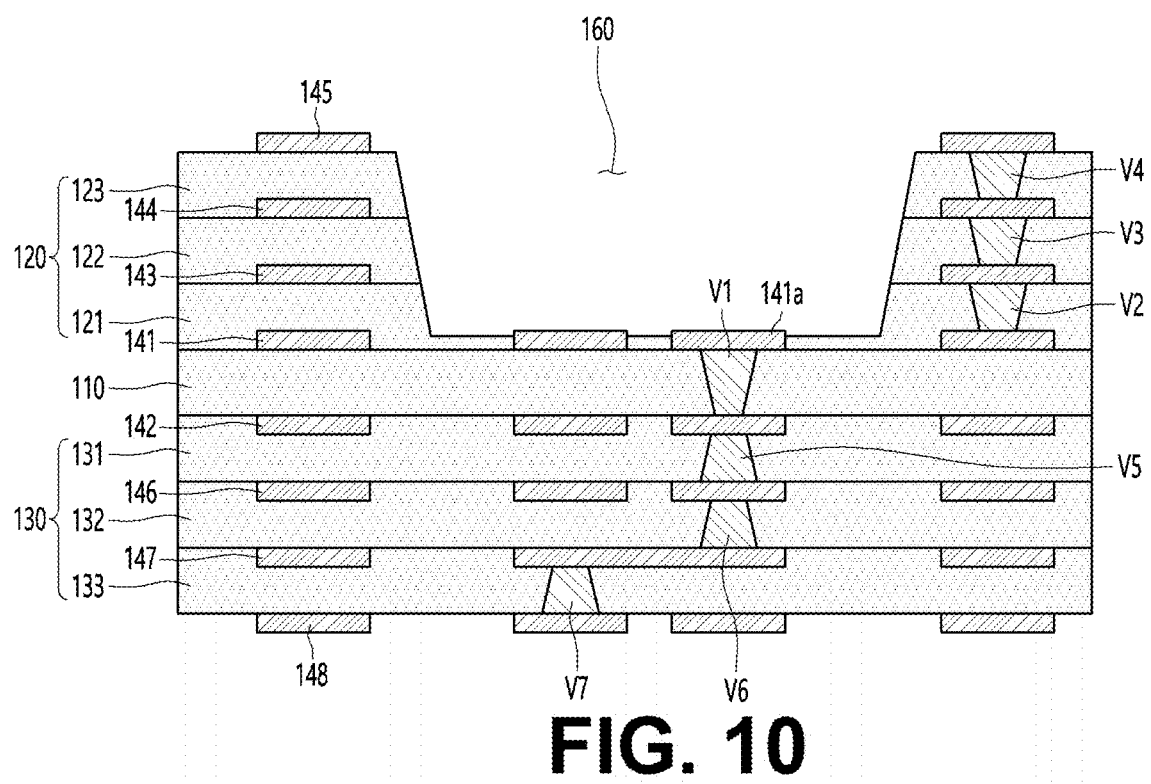

Referring to FIG. 10, the cavity 160 is formed in the second insulating layer 120 by controlling the sandblasting process conditions such as the conveyor speed conditions as described above.

In this case, the cavity 160 may be disposed to pass through at least one insulating layer among the second insulating layers 120 composed of the plurality of layers, and may be disposed to non-pass through at least another insulating layer.

Figure 11:
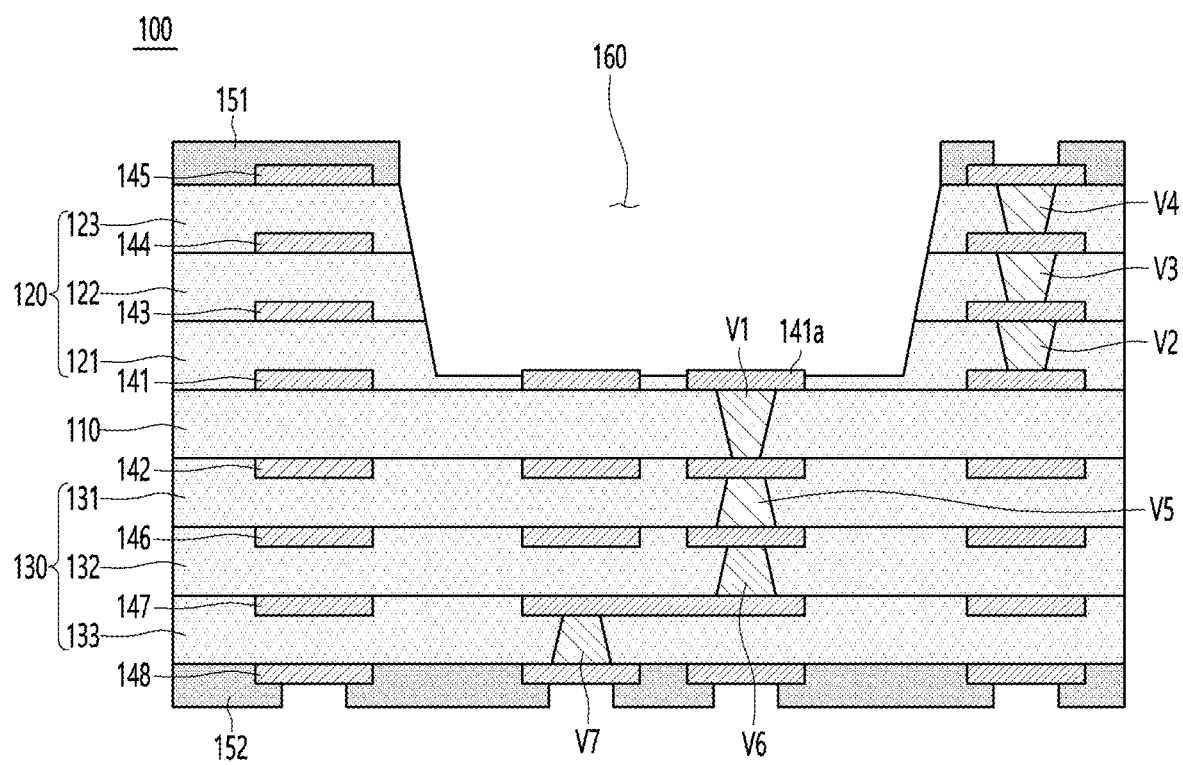

Next, referring to FIG. 11, protective layers 151 and 152 are formed on the outermost portions of the second insulating layer 120 and the third insulating layer 130.

For example, the first protective layer 151 may be disposed on the upper surface of the insulating layer disposed on the uppermost of the plurality of insulating layers. For example, the first protective layer 151 may be disposed on an upper surface of the second-third insulating layer 123 disposed on the uppermost portion of the second insulating layer 120. In addition, a second protective layer 152 may be disposed on a lower surface of the insulating layer disposed at the lowermost portion among the plurality of insulating layers. For example, a second protective layer 152 may be disposed on a lower surface of the third-third insulating layer 133 disposed at the lowermost portion of the third insulating layer 130.

The first protective layer 151 and the second protective layer 152 may each have an opening. For example, the first protective layer 151 may have an opening exposing the surface of the fifth circuit pattern to be exposed among the fifth circuit patterns 145 disposed on the upper surface of the second-third insulating layer 123.

Also, the second protective layer 152 may have an opening exposing the surface of the eighth circuit pattern to be exposed among the eighth circuit patterns 148 disposed on the lower surface of the third-third insulating layer 133.

The first protective layer 151 and the second protective layer 152 may include an insulating material. The first protective layer 151 and the second protective layer 152 may include various materials that can be cured by heating after being applied to protect the surface of the circuit patterns. The first protective layer 151 and the second protective layer 152 may be resist layers. For example, the first protective layer 151 and the second protective layer 152 may be a solder resist layer including an organic polymer material. For example, the first protective layer 151 and the second protective layer 152 may include an epoxy acrylate-based resin. In detail, the first protective layer 151 and the second protective layer 152 may include a resin, a curing agent, a photoinitiator, a pigment, a solvent, a filler, an additive, an acryl-based monomer, and the like. However, the embodiment is not limited thereto, and the first protective layer 151 and the second protective layer 152 may be any one of a photo solder resist layer, a cover-lay, and a polymer material.

A thickness of the first protective layer 151 and the second protective layer 152 may be 1 µm to 20 µm. The thickness of the first protective layer 151 and the second protective layer 152 may be 1 µm to 15 µm. For example, the thickness of the first protective layer 151 and the second protective layer 152 may be 5 µm to 20 µm. When the thickness of the first protective layer 151 and the second protective layer 151 is greater than 20 µm, the thickness of the printed circuit board may increase. When the thickness of the first protective layer 151 and the second protective layer 152 is less than 1 µm, the reliability of the circuit pattern may be deteriorated.

According to an embodiment, the printed circuit board includes a cavity. In this case, the cavity 160 has a non-passing structure rather than a passing structure through the second insulating layer 120. In this case, the cavity 160 exposes the pad 141a disposed on the first insulating layer 110. In addition, a bottom surface of the cavity 160 is positioned lower than an upper surface of the pad 141a. Accordingly, in the embodiment, it is not necessary to form an additional layer to form the cavity 160, and accordingly, the number of processes can be reduced. In addition, in the embodiment, it is possible to solve a loss due to a change in the thickness or shape of the pad 141a occurring in the process of removing the additional layer, and accordingly, product reliability may be improved.

In addition, according to the embodiment, the cavity 160 of the printed circuit board includes an inner wall S1 and a bottom surface S2. In this case, the inner wall S1 and the bottom surface S2 of the cavity 160 may not be flat and may have a certain surface roughness. In addition, an electronic device may be mounted on the pad 141a in the cavity 160. In addition, the molding layer 190 may be disposed in the cavity 160 to cover the electronic device. At this time, the inner wall and the bottom surface S2 of the cavity 160 have a certain surface roughness, so that the surface area in contact with the molding layer 190 can be increased, and accordingly, bonding strength during molding of the molding layer 190 may be improved.

Features, structures, effects, etc. described in the above embodiments are included in at least one embodiment, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the embodiments.

In the above, the embodiment has been mainly described, but this is only an example and does not limit the embodiment, those of ordinary skill in the art to which the embodiment pertains will appreciate that various modifications and applications not illustrated above are possible without departing from the essential characteristics of the present embodiment. For example, each component specifically shown in the embodiment can be implemented by modification. And differences related to such modifications and applications should be construed as being included in the scope of the embodiments set forth in the appended claims.

What is claimed is:

1. A printed circuit board comprising:
   a first insulating layer;
   a second insulating layer disposed on the first insulating layer and including a cavity;
   a pad disposed on the first insulating layer and exposed through the cavity;
   wherein the second insulating layer includes
   a first portion of region where the cavity is formed; and
   a second portion other than the first portion, and
   wherein an upper surface of the first portion is positioned higher than an upper surface of the first insulating layer and positioned lower than an upper surface on the pad, and
   wherein an upper surface of the second portion is positioned higher than the upper surface of the first insulating layer and the upper surface of the pad.

2. The printed circuit board of claim 1, wherein the upper surface of the first portion of the second insulating layer has a different height in a horizontal direction, and
   wherein an uppermost end of the upper surface of the first portion is positioned lower than the upper surface of the pad.

3. The printed circuit board of claim 1, wherein the second insulating layer includes
   a second-first insulating layer disposed on the first insulating layer; and
   a second-second insulating layer disposed on the second-first insulating layer,
   wherein the cavity includes
   a first part disposed in the second-first insulating layer; and
   a second part disposed in the second-second insulating layer.

4. The printed circuit board of claim 3, wherein the first part does not pass the second-first insulating layer, and
   wherein the second part passes through the second-second insulating layer.

5. The printed circuit board of claim 3, wherein the second-first insulating layer includes
   a first region overlapping the cavity in a vertical direction; and
   a second region that does not overlap the cavity in the vertical direction;
   wherein a thickness of the first region is smaller than a thickness of the second region.

6. The printed circuit board of claim 5, wherein an upper surface of the first region of the second-first insulating layer is positioned lower than the upper surface of the pad.

7. The printed circuit board of claim 5, wherein an upper surface of the first region of the second-first insulating layer has a surface curvature.

8. The printed circuit board of claim 1, wherein an upper width of the cavity is greater than a lower width of the cavity.

9. The printed circuit board of claim 1, wherein the pad has a structure protruding on the upper surface of the first insulating layer.

10. The printed circuit board of claim 9, wherein the first portion of the second insulating layer is disposed surrounding a side surface of the pad having the protruding structure.

11. The printed circuit board of claim 9, wherein the pad includes:
    a first pad and a second pad protruding on the upper surface of the first insulating layer and spaced apart from each other;
    wherein the first portion of the second insulating layer is disposed between the first pad and the second pad.

12. A package substrate comprising:
    a first insulating layer;
    a second insulating layer disposed on the first insulating layer and including a cavity;
    a pad disposed on the first insulating layer and exposed through the cavity;
    a connection portion disposed on the pad; and
    an electronic device disposed on the connection portion,
    wherein the second insulating layer includes:
    a second-first insulating layer disposed on the first insulating layer; and
    a second-second insulating layer disposed on the second-first insulating layer,
    wherein the cavity includes:
    a first part disposed in the second-first insulating layer; and
    a second part disposed in the second-second insulating layer,
    wherein the first part of the cavity does not pass the second-first insulating layer, and
    wherein the second part of the cavity passes through the second-second insulating layer.

13. The package substrate of claim 12, wherein a bottom surface of the first part of the cavity is positioned than the upper surface of the first insulating layer and positioned lower than the upper surface of the pad.

14. The package substrate of claim 12, wherein the pad has a structure protruding on the upper surface of the first insulating layer.

15. The package substrate of claim 14, wherein the second-first insulating layer includes:
    a first region overlapping the cavity in a vertical direction; and
    a second region that does not overlap the cavity in the vertical direction,
    wherein a thickness of the first region is smaller than a thickness of the second region.

16. The package substrate of claim 15, wherein the first region of the second-first insulating layer is disposed surrounding a side surface of the pad having the protruding structure.

17. The package substrate of claim 16, wherein the pad includes:
    a first pad and a second pad protruding on the upper surface of the first insulating layer and spaced apart from each other; and
    wherein the first region of the second-first insulating layer is disposed between the first pad and the second pad.

* * * * *